United States Patent [19]

Schenck

[11] Patent Number: 4,471,451
[45] Date of Patent: Sep. 11, 1984

[54] DIGITAL DATA SENSE AMPLIFIER AND SIGNAL DIFFERENTIATOR

[75] Inventor: Stephen R. Schenck, McKinney, Tex.

[73] Assignee: Texas Instruments Incorporated, Dallas, Tex.

[21] Appl. No.: 351,068

[22] Filed: Feb. 22, 1982

[51] Int. Cl.³ .......................... G06J 7/12; H03K 5/153
[52] U.S. Cl. ..................................... 364/605; 364/732; 307/359; 307/351; 328/165
[58] Field of Search ............... 364/605, 732, 602, 607; 328/127, 165, 164, 162; 307/359, 351, 358, 355, 530

[56] References Cited

U.S. PATENT DOCUMENTS

| | | | |
|---|---|---|---|
| 3,590,229 | 6/1971 | Humphreys | 364/732 |
| 3,928,756 | 12/1975 | Auray | 364/732 |
| 4,064,408 | 12/1977 | Hon et al. | 307/358 |
| 4,112,499 | 9/1978 | Mangum, Jr. et al. | 364/732 |
| 4,160,175 | 7/1979 | Trout | 307/351 |
| 4,183,025 | 1/1980 | Kutaragi et al. | 307/351 |
| 4,328,434 | 5/1982 | Geller | 307/350 |
| 4,352,030 | 9/1982 | Beesley | 307/350 |
| 4,398,154 | 8/1983 | Lee | 307/350 |

OTHER PUBLICATIONS

"A Bubble Memory Differential Detector," Wynn, W. D., The Bell System Technical Journal, vol. 60, No. 4, Apr. 1981, pp. 485-500.
"Type TIB0834 Bubble-Memory Dual Sense Amplifier," Texas Instruments, Inc., Jan. 1981.
"Floppy Disk Read Amplifier," Motorola(MC3470) Linear Interface Integrated Circuit Data Book, 1979, pp. 4-59-4-72.

Primary Examiner—Joseph F. Ruggiero
Assistant Examiner—John R. Lastova
Attorney, Agent, or Firm—Douglas A. Lashmit; N. Rhys Merrett; Melvin Sharp

[57] ABSTRACT

A digital data sense amplifier is disclosed for detecting small signal outputs from a storage media or from input sensors and comprises a differential amplifier whose outputs are coupled via two capacitors to an offset circuit which generates two offsets which in turn are fed to two comparators, one for a positive signal threshold and one for a negative signal threshold. This results in peak to peak data sensing in a noisy signal environment. An alternative embodiment differentiates an inputted analog signal and outputs a digital representation of the first derivative, or rate of change of said analog signal.

5 Claims, 1 Drawing Figure

DIGITAL DATA SENSE AMPLIFIER AND SIGNAL DIFFERENTIATOR

BACKGROUND OF THE INVENTION

The development of advanced digital processing systems has required a continual improvement in signal discrimination techniques in the circuits both utilizing storage media and those with direct signal sensing.

One method of approaching this problem is shown in the data book description of the MC3470, manufactured by Motorola. Pages 4-59 to 4-72 of the 1979 Motorola Linear Interface Integrated Circuit Data Book are hereby incorporated by reference, and provide a useful background of information.

One problem encountered has been in the discrimination of digital information from a relatively high noise level background signal. An example is in a magnetic bubble memory sense amplifier wherein the rotating field noise of the magnetic bubble drive system as well as additional noise generating factors make the signal discrimination extremely difficult.

Accordingly an object of the present invention is to provide an improved sense amplifier for detecting signals in a high noise environment.

A further object of the present invention is to provide a circuit capable of direct differentiation of an analog signal and conversion of that analog signal in one step into a digital representation of the first derivative.

A yet further object is to provide an improved data system utilizing a sense amplifier capable of detecting data in a signal having a relatively high noise component.

SUMMARY OF THE INVENTION

Briefly and in accordance with the present invention a digital data sensor is disclosed comprising means for providing a digital input signal, said signal having a background noise component; means for sensing said input signal and for detecting a maximum or minimum value of said signal, the value occuring during a predetermined time interval; means for measuring the relative change of these signals subsequent to the occurrence of the value during the predetermined time intervals; and means for outputting the measured change in a digital format.

A sense detector in accordance with the present invention comprises in combination means for periodic detection of binary information in signal, the signal having an analog noise component and at least one comparator circuit, said circuit operatively connected within a feedback loop, said loop capable of setting an upper or lower reference value, said comparator capable of comparing the set value to said signal.

Furthermore a sense detector as above may comprise means for amplification of the binary information.

The present invention comprises means for converting an analog electronic signal into a digital representation of the first derivative of the signal comprising: means for comparing a reference value to a signal; and means for incrementally pulsing the output of the means for converting as a function of time, dependent upon the rate of change of the magnitude of the analog signal.

Means for transforming an analog electrical signal into a digital representation of the slope of the analog signal in accordance with the present invention comprises a comparator circuit having a feedback loop, reference means providing an input for the comparator circuit and means for controlling the value of the referenced means as a digital function of the output of the comparator circuit utilizing the feedback loop.

A data system in accordance with the present invention comprises means for storing data in a storage medium and means for retrieving said data from said storage medium including a sense detector having a comparator connected in a feedback loop, said comparator operative to incrementally change a reference within the sense detector as a function of the magnitude of the signal input to said detector utilizing the feedback loop.

Furthermore, a data system according to the present invention may comprise means for storing data in a storage medium and means for retrieving the data from said storage medium including a sense detector having means for periodic detection of binary information in a signal, said signal having an analog noise component, and at least one comparator circuit, the circuit operatively connected within a feedback loop and capable of setting an upper or lower reference value, said comparator capable of comparing the set value with said signal.

A data system as above may further comprise means for amplification of the binary information.

A circuit for digital signal sensing or for differentiating an analog signal and converting the analog signal into a digital representation comprises a comparator circuit having a feedback loop; reference means providing an input for the comparator circuit; and means for controlling the value of the reference means as a function of the output of the comparator circuit utilizing the feedback loop. The above circuit may be integrated on a single substrate and may further comprise frequency filter means for limiting the frequencies inputted to the circuit. Additionally the circuit may comprise amplification means.

A data processing system in accordance with the present invention for digital signal sensing of for differentiating an analog signal and converting the analog signal into a digital representation comprises a comparator circuit having a feedback loop; reference means providing an input for the comparator circuit; and means for controlling the value of the reference means as the digital function of the output of the comparator circuit, utilizing the feedback loop. The data processing system may further comprise frequency filter means limiting the frequencies inputted to the circuit and may be integrated on a single substrate. The system as above may further comprise amplification means.

BRIEF DESCRIPTION OF THE DRAWING

Other objects and many of the attendant advantages of the present invention will be apparent as the same becomes better understood by reference to the following detailed description when considered in conjunction with the accompanying drawing FIGURE which is a schematic representation of a digital data sensing system according to one embodiment of the present invention.

DETAILED DESCRIPTION OF THE PREFERRED EMBODIMENT

Figure 1:
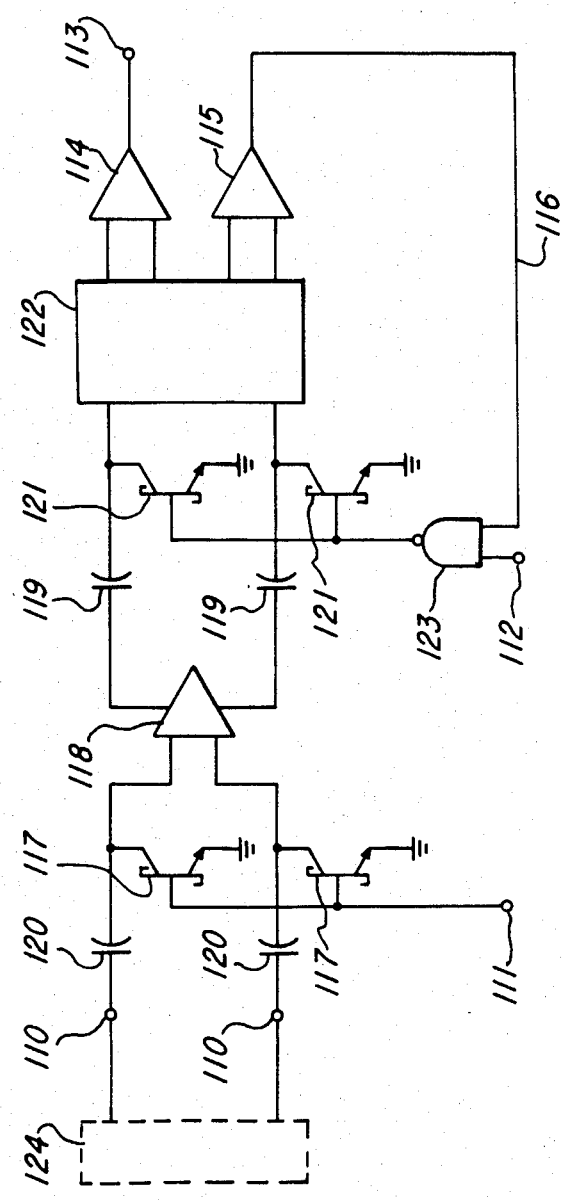

Referring now to the drawing a schematic block diagram in accordance with the present invention is shown wherein input connections 110 are coupled to a pair of matched capacitors 120 for DC isolation and to a pair of matched transistors 117, the outputs of which are coupled to the inputs of a differential amplifier 118. Signal input 111 to transistors 117 is a restorer input for initializing the circuit at the beginning of a detecting period. For example when the circuitry is utilized for detecting an output from a bubble memory chip the detection cycle is initiated by restorer input 111.

Block 124 represents a storage medium, for example, a magnetic bubble memory or a magnetic disk. An alternative embodiment of the present data system has no storage capability, in which case block 124 represents a direct signal generator. The gain of differential amplifier 118 may be from 1 to 1000 or more depending upon the particular application of the circuitry. A matched capacitor pair 119 is again used to isolate the amplification circuitry from the subsequent peak/valley detector circuitry.

A key feature of the invention is the differential amplification and the use of dual comparators for establishing an increment voltage signal which is utilized by a comparator 115 for signal detection. A comparator 114 is set at the expected peak-to-peak value of the signal.

In operation, the signal input into block 122 is compared to an offset value. After the initialization of the circuit through a second restorer input 112, the offset becomes 0. Block 122 represents a threshold voltage generator which couples the signal from capacitors 119 to the inputs of comparator 114 and 115, and determines the increment or threshold voltages for the comparators. The signal from amplifier 118 varies in an oscillatory manner. As the signal goes further negative, for example, 0.5 millivolts comparator 115 outputs a signal, and through a logic gate 123 resets the offset signal to a lower voltage. As the voltage decreases, the output of comparator 115 decreases by its increment voltage value, 0.5 millivolts in this example, until the lowest value of the incoming signal is reached.

Comparator 115 compares the negative-going value of the signal with the offset voltage and when the increment value is reached, the feedback loop 116 restores the offset voltage to the value of the signal. In this manner a series of digital feedback signals are utilized to lower the offset voltage as the circuitry, in this embodiment, detects the valley, or lowest voltage value of the incoming signal. Capacitors 119 store the reference voltage differentially as matched transistors 121 repeatedly reset the offset voltage to zero.

An alternative embodiment is utilized to reset the offset voltage to zero if a positive threshold is met or if a negative threshold is reached. This embodiment also requires a feedback connection at the output of comparator 114 to the restore logic gate 123.

Comparator 114 generates an output signal whenever the signal from input 110 is positive-going and exceeds a predetermined threshold voltage, i.e., the expected peak-to-peak value of the input signal, for example, +0.6 millivolts. In operation, as the signal from 110 first becomes more negative, the output of comparator 115 clamps the voltage input to block 122 to the lower value of the input signal 110. In the above example, this occurs each time the input voltage at 110 decreases by −0.5 millivolts. Then, as the input signal 110 starts to increase, comparator 114 outputs a signal to terminal 113 when the input signal increases by more than +0.6 millivolts. In this manner, the present system will effectively detect a low level signal even in the presence of a high background signal noise level.

It can be seen from this example that the amplifier 118 is not necessary to the operation of the invention, however it can be useful in certain applications where the incoming signal is extremely weak. The logic shown at 123 is a NAND gate, however, dependent upon the second restore signal 112 and the nature of the feedback signal coming in 116, various types of logic may be substituted for differing applications.

The matched transistors 121 and capacitor 119 are closely adjusted to have similar characteristics for best operation.

It may be seen additionally that the output signal at 116 represents a digital derivative of the input signal at 110. This occurs because the incoming signal has a negative slope in the previous example as it reaches a negative 0.5 millivolt value. A digital output at 116 resets transistors 121 to the lower offset value. A detector on 116 would receive the digital pulse and could be utilize to represent the rate of change of the incoming signal by one negative unit. Comparator 114, if similarly matched for the purpose of obtaining a differentiated signal, is normally set to the same value as comparator 115, only positive, and is connected to restore circuitry 123. In this manner as the signal varies positively an output at 113 is detected and as the signal varies negatively an output is detected at 116. In this manner a digital representation of the signal input a 110 is directly obtained. For example, a continuous positive ramp signal at 110 will result in a series of pulses outputted at Node 113, a pulse occurring each time the signal at point 110 increases by an increment corresponding to an offset voltage programmed into comparator 114. In a similar manner, a negative signal produces a series of pulses from comparator 115, a pulse occurring each time the inputted signal becomes less by an increment corresponding to the offset voltage programmed into comparator 115.

A bubble memory differential detector is described in an article by W.D. Wynn, published in the Bell System Technical Journal, Volume 60, No. 4, April, 1981, and is titled "A Bubble Memory Differential Detector". That article is useful for providing general background however on Page 494 it can be seen that the nondifferential aspect of the circuit provides for a single signal transmission line. The present invention, however, utilizes a differential technique which improves sensitivity as well as peak and valley detection capability within the same circuit. Furthermore, the present invention utilizes the feedback loop 116 to restore the signal on a real-time basis in response to the signal rather than as a clocked funtion. The Bell System technical journal article is incorported herein by reference.

The present invention has been demonstrated successfully in the embodiment utilized as a magnetic bubble memory sense amplifier, manufactured by Texas Instruments Incorporated, namely the TIB0834. The data sheet for that device discloses typical performance data for that part and is hereby incorporated by reference.

Although the preferred embodiment of the present invention has been described herein with reference to a specific circuit, various changes may be made without departing from the spirit and scope of the invention as defined in the claims appended hereto.

What is claimed is:

1. An asynchronous system for sensing digital data from an input signal comprising:
   first comparator means for determining the minimum level of said input signal, said first comparator means having a resettable offset, and producing a digital output signal when said input signal reaches a first predetermined level;

second comparator means for producing a digital output signal when said input signal exceeds said minimum level by a second predetermined level, said second comparator means having a resettable offset; and feedback means coupled to said first comparator means output for resetting said first and said second comparator means offsets to the value of said input signal whenever said first comparator means output signal is present.

2. The system of claim 1 wherein said second comparator output is coupled to said feedback means, and said first and said second comparator means offsets are reset to zero when said input signal exceeds either said first or said second predetermined levels.

3. The system of claim 1 wherein said feedback means includes a NAND gate having an input coupled to said first comparator means output and an input coupled to means for selectively enabling said feedback means.

4. The system of claim 2 wherein said feedback means includes a NAND gate having an input coupled to said first comparator means output, an input coupled to said second comparator means output, and an input coupled to means for selectively enabling said feedback means.

5. The system of claim 1 wherein said input signal is produced by means for retrieving data from a storage medium.

* * * * *